United States Patent
Kawakami et al.

[11] Patent Number: 5,702,996
[45] Date of Patent: Dec. 30, 1997

[54] INSULATION PASTE CONTAINING GLASS

[75] Inventors: Hiromichi Kawakami, Moriyama; Hiroji Tani, Nagaokakyo, both of Japan

[73] Assignee: Murata Mfg. Co., Ltd., Kyoto-fu, Japan

[21] Appl. No.: 720,053

[22] Filed: Sep. 27, 1996

[30] Foreign Application Priority Data

Sep. 29, 1995 [JP] Japan .................. 7-252282

[51] Int. Cl.⁶ .................. C03C 8/14; C03C 8/16
[52] U.S. Cl. .................. 501/14; 501/15; 501/20; 501/21; 501/65; 501/66
[58] Field of Search .................. 501/14, 15, 21, 501/32, 65, 66, 20

[56] References Cited

U.S. PATENT DOCUMENTS

| | | | |
|---|---|---|---|
| 4,952,531 | 8/1990 | Cherukuri | 501/65 |
| 5,017,521 | 5/1991 | Yale et al. | 501/65 |
| 5,173,457 | 12/1992 | Shorthouse | 501/65 |
| 5,219,801 | 6/1993 | Shorrock et al. | 501/65 |
| 5,342,674 | 8/1994 | Tanei et al. | 501/65 |
| 5,480,846 | 1/1996 | Sundberg et al. | 501/65 |

*Primary Examiner*—Karl Group
*Attorney, Agent, or Firm*—Ostrolenk, Faber, Gerb & Soffen, LLP

[57] ABSTRACT

Disclosed herein is a glass composition for insulation which comprises $SiO_2$ and at least one of $B_2O_3$ or $K_2O$ in a ratio falling within the region enclosed by lines passing through point A (65, 35, 0), point B (65, 20, 15), point C (85, 0, 15) and point D (85, 15, 0) on a composition diagram for the ternary system of $SiO_2$, $B_2O_3$ and $K_2O$. The glass composition can additionally contain at least one member selected from the group consisting of $Al_2O_3$, $La_2O_3$, CaO, $Ta_2O_5$ and $Nd_2O_3$ in an amount less than 25 parts by weight for 100 parts by weight of the major constituents.

20 Claims, 2 Drawing Sheets

INSULATION PASTE CONTAINING GLASS

BACKGROUND OF THE INVENTION

1. Field of the Invention

The present invention relates to a glass composition for insulation, an insulation paste, and a thick-film printed circuit.

2. Description of the Prior Art

Electronic machines and equipment have thick-film multi-layer printed circuits of various structure. They are usually constructed of a stack of conductive films formed on insulating layers. In the case where the conductive film is exposed, it may be connected to another conductor by soldering. There are also instances where the insulating layer is in contact with resistors. In the case of a single-layer circuit, an insulating substrate supports an insulating layer which in turn supports resistors and wirings formed thereon.

Recent electronic machines and equipment are becoming more compact and faster and require that the insulating layer for thick-film multi-layer or single-layer printed circuits have a high insulating performance as well as a low dielectric constant. It has been common practice to make insulating layers of low dielectric constant from an epoxy resin-based material. Unfortunately, resin-based insulating materials are poor in durability at high temperatures. Therefore, there has been a demand for an insulating material having good durability.

It is further required that the conductive film firmly bond to the insulating layer so that no peeling occurs due to heat shock at the time of soldering. It is also required that the thick-film conductors or resistors in contact with the insulating layer remain essentially unchanged in their characteristic properties when they are exposed to the firing heat or environment during their formation. It is desirable that the insulating layer be formed at a comparatively low temperature.

SUMMARY OF THE INVENTION

It is an object of the present invention to provide a new electrical insulating material which has a suitable dielectric constant and meets the above-mentioned requirements. This insulating material is a glass composition rather than a resin-based material.

The glass composition according to the present invention comprises a major component including $SiO_2$ and at least one of $B_2O_3$ or $K_2O$ and at least one member selected from the group consisting of $Al_2O_3$, $La_2O_3$, CaO, $Ta_2O_5$, and $Nd_2O_3$ in an amount less than 25 parts by weight for 100 parts by weight of said major component. The major component has a ratio falling within the region enclosed by lines passing through point A (65, 35, 0), point B (65, 20, 15), point C (85, 0, 15), and point D (85, 15, 0) on the composition diagram for a ternary system of $SiO_2$, $B_2O_3$ and $K_2O$.

The glass composition may be made into an insulation paste by combination with an organic vehicle and optionally $Al_2O_3$ powder or colloid.

The insulation paste is used to form insulating layers in thick-film multi-layer printed circuits. The resulting insulating films permit conductive films to be formed thereon with high bond strength. They have a low dielectric constant and exhibit good insulating properties, without impairing the characteristic properties of the adjacent thick-film conductive films and resistors.

BRIEF DESCRIPTION OF THE DRAWING(S)

DETAILED DESCRIPTION OF THE INVENTION

Figure 1:
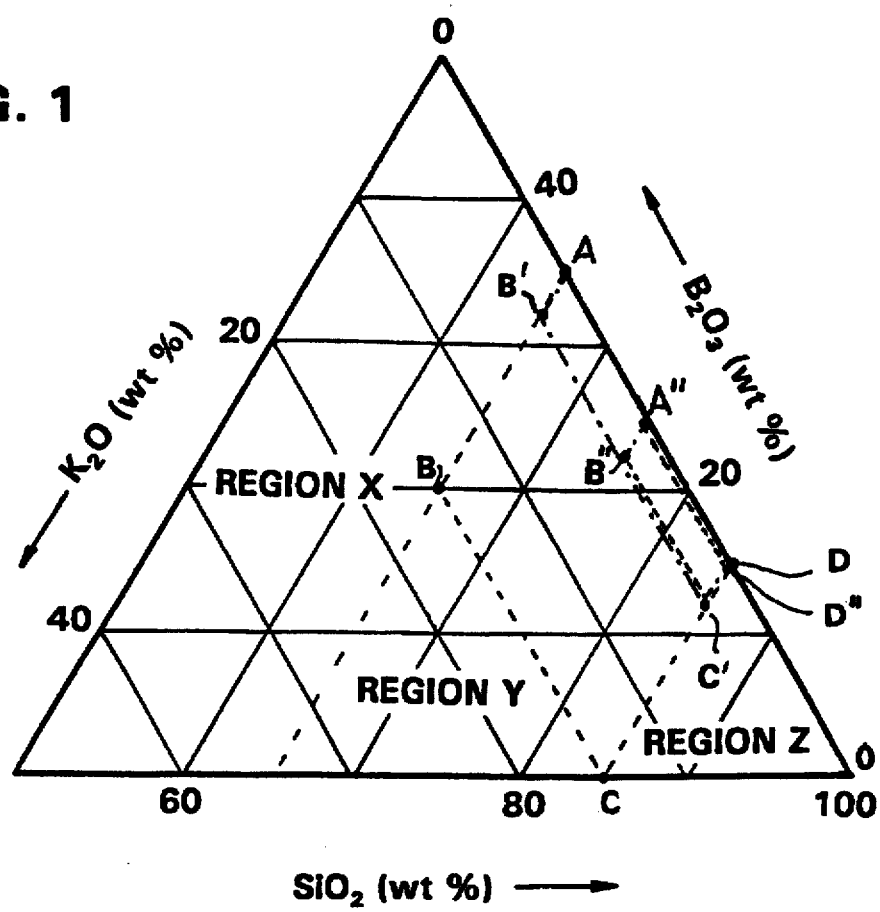
FIG. 1 is a composition diagram showing the ratio of the constituents of the glass composition for insulation pertaining to the present invention.

The gist of the present invention resides in a glass composition for insulation which comprises $SiO_2$ and at least one of $B_2O_3$ or $K_2O$ in a ratio falling within the region enclosed by lines passing through point A (65, 35, 0), point B (65, 20, 15), point C (85, 0, 15) and point D (85, 15, 0) on a composition diagram for the ternary system, as shown in FIG. 1.

In a preferred embodiment, the glass composition for insulation contains, in addition to said major constituents including $SiO_2$ and at least one of $B_2O_3$ or $K_2O$, at least one kind of refining agent selected from the group consisting of $Al_2O_3$, $La_2O_3$, CaO, $Ta_2O_5$ and $Nd_2O_3$ in an amount less than 25 parts by weight for 100 parts by weight of the major constituents.

The resulting glass composition for insulation is usually made into a powder, which is further incorporated with an organic vehicle to give a paste. The paste is formed into a thick-film insulating layer on an appropriate substrate by printing and subsequent firing.

According to the present invention, the insulation paste for thick-film insulating layer comprises the glass composition defined above, an organic vehicle, and optionally $Al_2O_3$ powder or $Al_2O_3$ colloid, with the amount of the glass composition being 60–99.5 parts by weight for 100 parts by weight of the total amount of the glass composition and $Al_2O_3$ powder or $Al_2O_3$ in the $Al_2O_3$ colloid.

The insulation paste, upon firing, yields an insulating layer which constitutes the thick-film printed circuit covered by the present invention.

EXAMPLES

Figure 2:
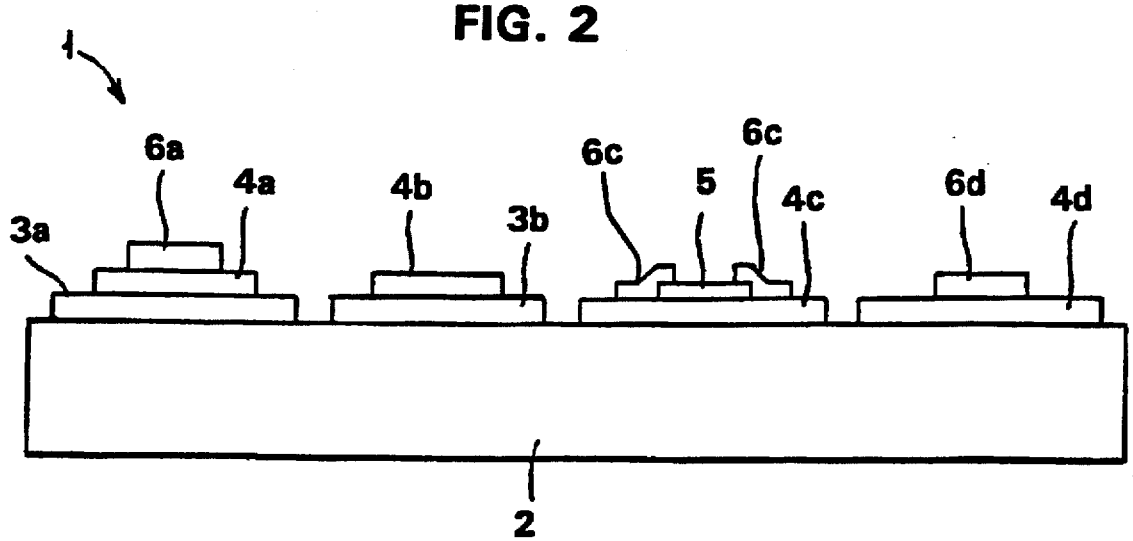
FIG. 2 is a sectional view showing the thick-film multi-layer printed circuit produced in an Example.

A thick-film multi-layer printed circuit pertaining to the present invention is demonstrated in the first example and as schematically shown in section in FIG. 2. It is specially designed for evaluation of characteristic properties.

There is shown a substrate 2 on which lower conductive films 3a and 3b are formed, the former functioning as a capacitor electrode to form a capacitor, the latter functioning as a fine wire to examine the conductor for change in resistance. Insulating layer 4a and 4b are formed on the lower conductive films 3a and 3b, respectively, and insulating layers 4c and 4d are formed on the substrate 2. The insulating layers 4a–4d are formed by coating and subsequent firing of the insulation paste of the present invention. A thick-film resistor 5 is formed on the insulating layer 4c. Upper conductive films 6a, 6c and 6d are formed on the insulating layers 4a, 4c and 4d, respectively. The upper conductive film 6a functions as a capacitor electrode to form a capacitor with the opposite conductive film 3a. The upper conductive film 6c is electrically connected to the thick-film resistor 5 so as to function as a terminal electrode for the thick-film resistor 5. The upper conductive electrode 6d functions as a means to measure bond strength for the insulating layer 4d.

The thick-film multi-layer printed circuit 1 is formed in the following manner. On the substrate 2 of alumina are formed the lower conductive films 3a and 3b from a silver paste by screen printing and subsequent firing at 850° C. The lower conductive film 3a (for the capacitor) is circular, 8 mm in diameter, and the lower conductive film 3b (for resistance measurement) is 1.2 mm long and 100 μm wide. At this stage, resistance across the lower conductive film 3b is measured.

The insulating layers 4a to 4d are formed from an insulation paste which is prepared in the following manner. The raw materials for the vitreous component of the paste are $SiO_2$, $B_2O_3$, $K_2CO_3$, $Al(OH)_3$, $La_2O_3$, $CaCO_3$, $Ta_2O_5$ and $Nd_2O_3$. They are mixed according to the formula shown in Table 1 below, and the mixture is melted at 1500°–1750° C. as specified. The temperature selected is one at which the mixture is expected to melt. The resulting melt is quenched and then crushed to give a glass powder which has the softening point as shown in Table 1. The glass powder is mixed with an organic vehicle (a solution of ethyl cellulose in α-terpineol) in a ratio of 70:30 by weight. In this way there is obtained the desired insulation paste.

TABLE 1

| Sample No. | Formula | | | | | | | | Softening point (°C.) |
|---|---|---|---|---|---|---|---|---|---|
| | $SiO_2$ | $B_2O_3$ | $K_2O$ | $Al_2O_3$ | $La_2O_3$ | CaO | $Ta_2O_5$ | $Nd_2O_3$ | |
| 1* | 60 | 30 | 10 | | | | | | 700 |
| 2 | 65 | 35 | | | | | | | 680 |
| 3 | 65 | 20 | 15 | | | | | | 720 |
| 4* | 70 | 10 | 20 | | | | | | 710 |
| 5 | 70 | 28 | 2 | | | | | | 720 |
| 6 | 75 | 23 | 2 | | | | | | 760 |
| 7 | 79 | 19 | 2 | | | | | | 800 |
| 8 | 83 | 10 | 7 | | | | | | 950 |
| 9 | 85 | | 15 | | | | | | 1050 |
| 10 | 85 | 15 | | | | | | | 950 |
| 11* | 90 | 5 | 5 | | | | | | >1050 |
| 12 | 79 | 19 | 2 | 25 | | | | | 790 |
| 13 | 79 | 19 | 2 | | 25 | | | | 780 |
| 14 | 79 | 19 | 2 | | | 25 | | | 740 |
| 15 | 79 | 19 | 2 | | | | 25 | | 730 |
| 16 | 79 | 19 | 2 | | | | | 25 | 750 |

*Outside the scope of the present invention.

After the formation of the lower conductive films 3a and 3b, the insulating layers 4a to 4d are formed from the insulation paste by screen printing and subsequent firing in the air. The firing temperature is shown in Table 2. The insulating layer 4a (which is formed on the lower conductive layer 3a) is circular, 6 mm in diameter. The insulating layer 4b is formed on the lower conductive film 3b so as to have both ends of film 3b remaining exposed. The insulating layers 4c and 4d are formed on the substrate 2.

Then, on the insulating layer 4c is formed the thick-film resistor 5 from a $Ru_2O_3$-based resistor paste by screen printing and subsequent firing at 850° C.

The upper conductive films 6a, 6c and 6d are formed from a copper paste by screen printing and subsequent firing at 580° C. in an atmosphere of nitrogen. The upper conductive film 6a (which is formed on the insulating layer 4a) is circular, 4 mm in diameter. The upper conductive films 6c are formed such that they function as terminal electrodes for the thick-film resistor 5. The upper conductive film 6d (which is formed on the insulating layer 4d) is square (2×2 mm) and is intended to evaluate its strength of bonding to the insulating layer 4d.

In this way there is obtained the thick-film multi-layer printed circuit 1 as shown in FIG. 2.

TABLE 2

| Sample No. | Firing temperature (°C.) | Relative dielectric constant ($\epsilon_r$) | Dielectric loss tan δ (%) | Insulation resistance log IR | Rate of change in wiring resistance (%) | Bond strength (kgf/2 mm) |
|---|---|---|---|---|---|---|
| 1* | 850 | 6.0 | 0.2 | 10 | 15 | 0.8 |
| 2 | 850 | 4.6 | 0.1 | >12 | 6.0 | 0.8 |
| 3 | 850 | 6.9 | 0.3 | >12 | 5.0 | 1.0 |
| 4* | 850 | 8.0 | 0.4 | 10 | 12 | 1.2 |
| 5 | 850 | 4.8 | 0.1 | >12 | −0.5 | 0.9 |
| 6 | 850 | 4.8 | 0.2 | >12 | 0.5 | 1.0 |
| 7 | 850 | 4.6 | 0.1 | >12 | −1.0 | 1.0 |
| 8 | 1000 | 6.2 | 0.3 | >12 | 0.5 | 1.2 |
| 9 | 1000 | 7.0 | 0.3 | >12 | 10 | 1.3 |
| 10 | 950 | 4.0 | 0.1 | >12 | 9 | 1.2 |
| 11* | 1000 | unable to form film | | | | |
| 12 | 850 | 6.1 | 0.4 | >12 | 1.8 | 1.3 |
| 13 | 850 | 6.2 | 0.4 | >12 | 2.2 | 0.8 |
| 14 | 850 | 6.3 | 0.3 | >12 | 3.5 | 1.0 |
| 15 | 850 | 6.1 | 0.3 | >12 | 4.2 | 1.1 |
| 16 | 850 | 6.9 | 0.5 | >12 | 3.6 | 1.2 |

*Outside the scope of the invention.

The characteristic properties in Table 2 were measured in the following manner. As for the insulating layer 4a, its characteristic properties were measured by regarding it as a capacitor's dielectric layer held between the lower conductive film 3a and the upper conductive film 6a as the opposing electrodes. The electrostatic capacity and dielectric loss (tan δ) were measured at 1 MHz, 1 $V_{rms}$, and 25° C., and the relative dielectric constant ($\epsilon_r$) was calculated from the electrostatic capacity obtained and the dimensions of the capacitor used. Also, the insulation resistance (IR) was measured by application of a voltage of 50V for 1000 hours at 85° C. and 85% RH and subsequent application of 100V (DC) for 1 minute.

The rate of change in wiring resistance was obtained by comparing the resistance across the lower conductive film 3b with that which was measured before the insulating layer 4b was formed.

Figure 3:
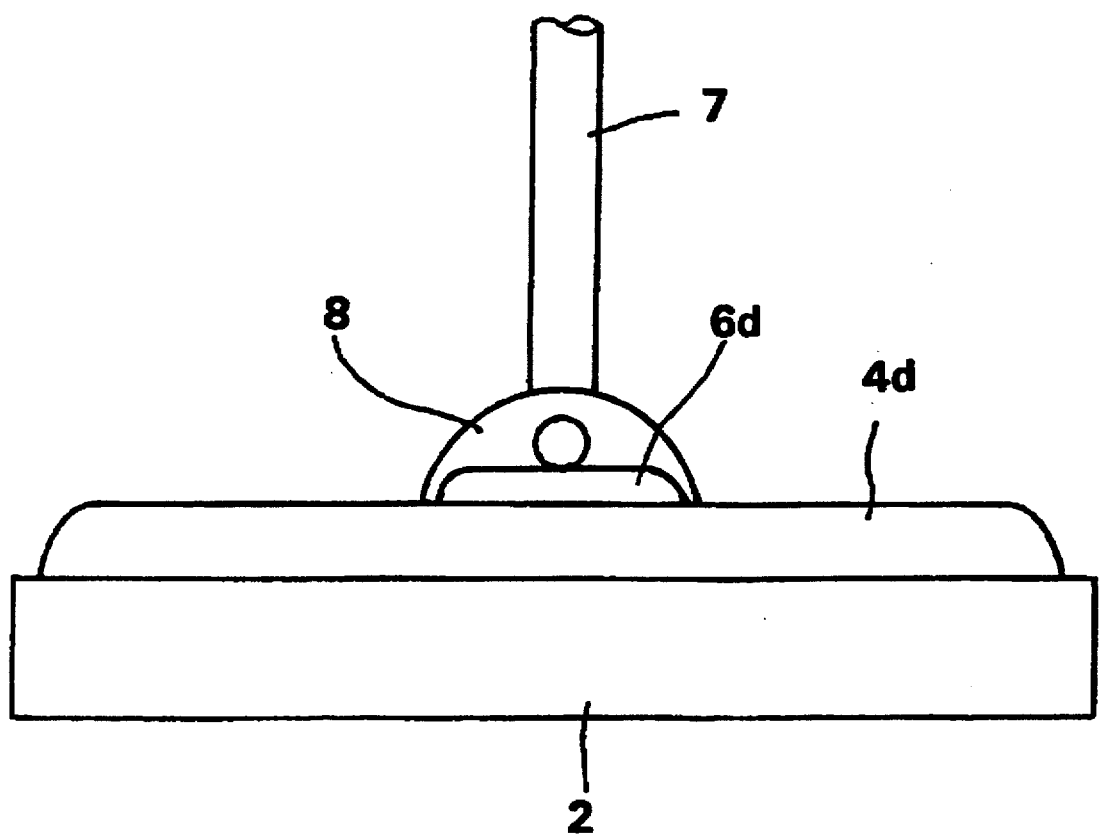
FIG. 3 is an enlarged sectional view of the thick-film multi-layer printed circuit shown in FIG. 2 and shows how a soft copper wire 7 is soldered to measure the bond strength of the upper conductive film 6d.

The bond strength (after soldering) of the upper conductive layer 6d was evaluated by pulling an L-shaped soft copper wire 7 attached to the upper conductive film 6d with solder 8, as shown in FIG. 3.

The thick-film resistor 5 of Samples 1 and 7 was measured for resistance and temperature coefficient. Three different specimens of the thick-film resistor 5 were prepared from three kinds of resistance paste, whose value of sheet resistivity were 20 Ω/square, 2 kΩ/square, and 2 MΩ/square, respectively. Resistance measurements were carried out at 25° C. for fifty specimens of the thick-film resistor 5 and an average (together with dispersion, i.e. the standard deviation from the mean) was obtained. The temperature coefficient of resistance is expressed in terms of ppm/°C. by HTCR (which is the rate of change in resistance between 25° C. and 150° C.) and CTCR (which is the rate of change in resistance between 25° C. and −55° C.) compared with the resistance at 25° C. as reference. For comparison, measurements were performed in the same manner as above on comparative Samples 1 and 2, the former containing Al—B—Si glass as the glass component in the insulation paste for the insulating layer 4c, the latter containing a resin-based material in place of the glass component in the insulation paste for the insulating layer 4c. The results of these measurements are shown in Table 3 below.

respectively, in FIG. 1, which are outside the region conforming to the present invention.

Compositions falling within region X are not desirable because the insulating layer 4a has a load insulation resistance in wet condition as low as $1\times10^{10}$ Ω(log IR=10) and the rate of change in wiring resistance of the lower conductive film 3b is as great as 15%, as demonstrated by Sample 1 in Table 2. Moreover, in the case of such compositions, the thick-film resistor 5 greatly fluctuates in resistance and exhibits a large temperature coefficient of resistance, as demonstrated by Sample 1 in Table 3.

Compositions falling within region Y are not desirable because the insulating layer 4a has a relative dielectric constant as high as 8.0 and also has a load insulation resistance in wet condition as low as $1\times10^{1010}$ Ω(log IR=10). The rate of change in wiring resistance of the lower conductive film 3b is as great as 12%, as demonstrated by Sample 2 in Table 2.

Compositions falling within region Z are not desirable because they do not permit the insulating layers 4a to 4d to be formed by firing even at 1000° C. by reason of the high glass softening point exceeding 1050° C., as demonstrated by Sample 11 in Table 1.

Samples 12 to 16 given in Tables 1 and 2 contain, in addition to 100 parts by weight in total of the three major constituents, $SiO_2$, $B_2O_3$, and $K_2O$, 25 parts by weight of $Al_2O_3$, $La_2O_3$, CaO, $Ta_2O_5$ or $Nd_2O_3$. In other words, they are identical with Sample 7 as far as the three major constituents are concerned. However, Sample 12 addition-

TABLE 3

| | Sheet resistivity of resistance paste (Ω/square) | Characteristic properties of resistor | | | |
|---|---|---|---|---|---|
| | | Resistance | | Temperature coefficient of resistance | |
| | | Average (Ω) | Dispersion (%) | HTCR (ppm/°C.) | CTCR |
| Sample 1* | 20 | 20.8 | 18 | 223 | 572 |
| | 2k | 8.2k | 15 | 518 | 324 |
| | 2M | 16.2M | 12 | −349 | −546 |
| Sample 7 | 20 | 10.5 | 8.1 | 70 | 26 |
| | 2k | 0.73k | 2.9 | 162 | 122 |
| | 2M | 0.98M | 5.5 | 25 | −80 |
| Comparative sample 1* (Al—B—Si glass) | 20 | 10.7 | 5.3 | 141 | 97 |
| | 2k | 1.1k | 4.2 | 63 | −5 |
| | 2M | 1.3M | 5.9 | −60 | −158 |
| Comparative sample 2* (without glass) | 20 | 9.4 | 5.9 | 58 | 4 |
| | 2k | 1.2k | 4.2 | 24 | −46 |
| | 2M | 2.4M | 8.6 | −98 | −201 |

*Outside the scope of the present invention.

On the basis of the characteristic properties shown in Tables 1 to 3, the desirable formula for $SiO_2$, $B_2O_3$, and $K_2O$ was established and indicated in composition diagram as shown in FIG. 1. As Table 1 shows, the glass composition for insulation is composed of $SiO_2$ and at least one of $B_2O_3$ or $K_2O$, and the formula (by weight) for these components is defined by the region enclosed by lines passing through point A (65, 35, 0), point B (65, 20, 15), point C (85, 0, 15), and point D (85, 15, 0) on the composition diagram for the ternary system as shown in FIG. 1.

Samples 1 to 11 (given in Tables 1 to 3) do not contain any $Al_2O_3$, $La_2O_3$, CaO, $Ta_2O_5$ or $Nd_2O_3$. Samples 2, 3 and 5 to 10 conform to the present invention, and Samples 1, 4, and 11 are outside the scope of the present invention. Samples 1, 4 and 11 are in region X, region Y, and region Z, ally contains $Al_2O_3$, Sample 13 additionally contains $La_2O_3$. Sample 14 additionally contains CaO, Sample 15 additionally contains $Ta_2O_5$, and Sample 16 additionally contains $Nd_2O_3$. The amount of the additional component is 25 parts by weight for 100 parts by weight of the three major constituents in total.

Comparison of Samples 12–16 with Sample 7 shows that incorporation with any of $Al_2O_3$, $La_2O_3$, CaO, $Ta_2O_5$ and $Nd_2O_3$ makes it possible to control the glass softening point shown in Table 1 and hence makes it easier to form the insulating layer. Moreover, these additional components permit one to regulate the relative dielectric constant within certain limits if appropriate use is made of their disadvantage of increasing the relative dielectric constant.

It is desirable that these additional components ($Al_2O_3$, $La_2O_3$, CaO, $Ta_2O_5$ or $Nd_2O_3$) should be used in an amount less than about 25 parts by weight for 100 parts by weight of the total of the three major constituents ($SiO_2$, $B_2O_3$, and $K_2O$). A superfluous amount leads to a high relative dielectric constant (in excess of 7.5) and an increased glass softening point, which makes it difficult to form the insulating layer. These additional components may be used alone, as in this example, or in combination with one another so long as the total amount is less than 25 parts by weight.

According to the detailed analysis of the obtained test results, it is preferable that the additional components ($Al_2O_3$, $La_2O_3$, CaO, $Ta_2O_5$ or $Nd_2O_3$) should be used in an amount less than about 5 parts by weight and that the ratio of the glass composition falls within the region enclosed by lines passing through point A (65, 35, 0), point B' (65, 32, 3), point C' (85, 12, 3) and D (85, 15, 0), and more preferably, A" (75, 24.5, 0.5), point B" (75, 22, 3), point C' (85, 12, 3) and D" (85, 14.5, 0.5). In the case, the glass composition having a lower dielectric constant of about or less than 5 is obtained.

The insulating layer obtained as mentioned above will be improved in strength if it is formed from another insulation paste which is demonstrated in the next example. This insulation paste contains $Al_2O_3$ in powder or colloid form in addition to the glass composition and organic vehicle contained in the above-mentioned insulation paste. The insulation paste in this example contains, as the glass composition, the same glass powder as used in Sample 7 mentioned above. Each Sample in this example was prepared by mixing the glass powder with $Al_2O_3$ powder or $Al_2O_3$ colloid in an amount specified in Table 4. (The amount of $Al_2O_3$ colloid is expressed in terms of the weight of $Al_2O_3$.)

TABLE 4

| Sample No. | Glass powder (as used in Example 7) (parts by weight) | $Al_2O_3$ powder (parts by weight) | $Al_2O_3$ colloid (parts by weight) |
| --- | --- | --- | --- |
| 17 | 100 | | |
| 18 | 99.5 | 0.5 | |
| 19 | 95 | 5 | |
| 20 | 90 | 10 | |
| 21 | 80 | 20 | |
| 22 | 70 | 30 | |
| 23 | 60 | 40 | |
| 24* | 50 | 50 | |
| 25 | 60 | | 40 |
| 26* | 50 | | 50 |

*Outside the scope of the present invention.

Each insulation paste (as Samples 17 to 26) was prepared by incorporating the mixture of the glass powder and $Al_2O_3$ powder or $Al_2O_3$ colloid (70 parts by weight in total) with the organic vehicle (30 parts by weight). The organic vehicle was a solution of ethyl cellulose in α-terpineol (the same one as used in the previous example) except in Samples 25 and 26 which contain $Al_2O_3$ colloid. The organic vehicle in Samples 25 and 26 is an aqueous binder. Incidentally, Sample 17, which contains neither $Al_2O_3$ powder nor $Al_2O_3$ colloid, is identical with Sample 7.

Each insulation paste from Samples 17 to 26 was used to form the thick-film multi-layer printed circuit 1 as shown in FIG. 2 in the same manner as mentioned in the previous example. A fixed firing temperature of 850° C. was used for all the Samples, as shown in Table 5. The resulting specimens were tested for relative dielectric constant, dielectric loss, insulation resistance, and bond strength in the same manner as in the previous example. The results are shown in Table 5.

TABLE 5

| Sample No. | Firing temperature (°C.) | Relative dielectric constant ($\epsilon_r$) | Dielectric loss tan δ (%) | Insulation resistance log IR | Bond strength (kgf/ 2 mm) |
| --- | --- | --- | --- | --- | --- |
| 17 | 850 | 4.6 | 0.1 | >12 | 1.0 |
| 18 | 850 | 4.7 | 0.1 | >12 | 1.2 |
| 19 | 850 | 4.9 | 0.1 | >12 | 1.6 |
| 20 | 850 | 5.3 | 0.2 | >12 | 1.8 |
| 21 | 850 | 5.8 | 0.2 | >12 | 2.0 |
| 22 | 850 | 6.0 | 0.4 | >12 | 2.4 |
| 23 | 850 | 6.0 | 0.6 | >12 | 2.4 |
| 24* | 850 | 6.0 | 2.3 | <9 | 2.6 |
| 25 | 850 | 5.9 | 0.5 | >12 | 2.5 |
| 26* | 850 | 6.1 | 4.0 | <9 | 2.4 |

*Outside the scope of the invention.

It is apparent from Tables 4 and 5 that $Al_2O_3$ improves the bond strength of the upper conductive film 6d on the insulating layer 4d, while keeping the relative dielectric constant below 7. It is noted from a comparison of Sample 17 and Sample 18 that $Al_2O_3$ produces its effect of improving bond strength even when its amount is only about 0.5 part by weight. On the other hand, $Al_2O_3$ in an excess amount (about 50 parts by weight or above), as in Samples 24 and 26, makes the insulating layer less dense and hence poor in insulation resistance. It is concluded from these results that the adequate amount of $Al_2O_3$ should be in the range of about 0.5 to 40 parts by weight, and preferably about 10–30 parts. That is, the amount of the glass composition should be about 60–99.5, and preferably about 75–85, parts by weight for 100 parts by weight of the total glass composition and $Al_2O_3$.

Although the present invention has been described in its preferred form, it is to be understood that modifications may be made as shown below without departing from the scope of the invention.

For example, the organic vehicle, which is added to the glass component to give the insulation paste, is not limited to a solution of ethyl cellulose in α-terpineol. The solute may be replaced by nitrocellulose, acrylic resin, butyral resin or the like. The solvent may be replaced by alcohols (e.g., butyl carbitol), esters (e.g., acetates), kerosene or the like. In addition, the organic vehicle may be include a plasticizer (e.g., phthalate ester) depending on the application.

Although the above-mentioned examples demonstrate the firing in air of the insulation paste, the same effect will be produced even in the case of firing in a neutral atmosphere such as nitrogen.

In the foregoing, the present invention has been described as related to the insulation paste and the glass composition for insulation which are used to form insulating layers in the thick-film multi-layer printed circuit. However, they can also be used as an underglaze for single-layer circuits so as to stabilize the characteristics of resistors and wirings.

The alumina substrate shown above is not limitative; the present invention does not preclude using dielectric substrates, multi-layered substrates, and insulating substrates (such as glass substrates).

The above-mentioned examples illustrate an instance in which the upper conductive film 6d contains a copper-based conductor; however, the same effect will be produced even in the case where copper is replaced by Ag, Ag/Pd, Ag/Pt, Au, Ni or the like. In addition, the conductive film may be coated with a metal film (of, for instance, Ni, Sn, Sn—Pd, Pd, Au, Ag or Cu) by electrolytic or electroless plating.

The above-mentioned examples illustrate an instance where the thick-film resistor 5 is formed from a $Ru_2O_3$-based resistance material; however, the same effect will be produced even in the case where it is replaced by a $LaB_6$-based material or the like.

As is explained in detail, the present invention provides a glass composition for insulation, which is based on a glass component and hence is superior to resin-based materials in durability at high temperatures. The glass composition has a low dielectric constant and exhibits good insulating properties, as demonstrated in Examples. It has a comparatively low glass softening point (below about 1050° C.) and hence is capable of sintering at comparatively low temperatures (below about 1050° C.). Therefore, it can be easily formed into insulating layers. The insulating layer does not impair the characteristic properties of its adjacent thick-film conductor or resistor during sintering. In addition, the insulating layer permits a conductive film to be formed thereon with a comparatively high bond strength between them. This bond strength is substantially immune to heat shock due to soldering.

The glass composition pertaining to the present invention will find use as an insulating material for insulation layers to be formed in thick-film multi-layer or single-layer printed circuits which meet requirements for making electronic machines and equipment faster and more compact.

The glass composition pertaining to the present invention may contain, in addition to 100 parts by weight of $SiO_2$ and at least one of $B_2O_3$ and $K_2O$, less than 25 parts by weight of at least one member selected from the group consisting of $Al_2O_3$, $La_2O_3$, $CaO$, $Ta_2O_5$ and $Nd_2O_3$. These additional components permit the glass softening point and dielectric constant to be adjusted as desired.

The insulation paste pertaining to the present invention can contain $Al_2O_3$ powder or $Al_2O_3$ colloid in addition to the above-mentioned glass composition and organic vehicle. This additional component increases the strength of the insulating layer formed by sintering from the insulation paste. In other words, it yields minute crystals in the amorphous glass, thereby producing said effect. It also protects the insulating layer from cracking when the conductive film formed thereon undergoes soldering because it causes the insulating layer to have a coefficient of thermal expansion close to that of solder.

A thick-film printed circuit employing the present invention has an insulating layer with the above-mentioned advantages. Therefore, especially in the form of thick-film multi-layer printed circuit, it is advantageously applied to faster and more compact electronic machines and equipment.

What is claimed is:

1. An insulation paste consisting of:
    a glass consisting of a combination of at most $SiO_2$, $B_2O_3$, $K_2O$ and refining agent, said glass having the composition ratio denoted as $xSiO_2$—$yB_2O_3$—$zK_2O$ in which x, y and z designate the weight percent of the constituent components and which falls within the area bounded by lines connecting points A (x=65, y=35, z=0), B (x=65, y=20, z=15), C (x=85, y=0, z=15) and D (x=85, y=15, z=0) and containing less than about 100 parts by weight of said $xSiO_2$—$yB_2O_3$—$zK_2O$ of at least one refining agent selected from the group consisting of $Al_2O_3$, $La_2O_3$, $CaO$, $Ta_2O_5$ and $Nb_2O_3$;
    $Al_2O_3$ filler in an amount of 0 or about 0.5 to 40 weight percent based on the combined weight of the glass and filler; and an organic vehicle.

2. An insulation paste according to claim 1, wherein the area is surrounded by lines connecting points A, B' (x=65, y=35, z=3), C' (x=85, y=12, Z=3) and D.

3. An insulation paste according to claim 1, wherein the area is surrounded by lines connecting points A" (x=75, y=24.5, z=0.5), B" (x=75, y=22, z=3), C" (x=85, y=12, z=3) and D" (x=85, y=14.5, z=0.5).

4. An insulation paste according to claim 3, wherein the refining agent is present and is in an amount of less than about 5 parts by weight per 100 parts of said $xSiO_2$—$yB_2O_3$—$zK_2O$.

5. An insulation paste according to claim 2, wherein the refining agent is present and is in an amount of less than about 5 parts by weight per 100 parts of said $xSiO_2$—$yB_2O_3$—$zK_2O$.

6. An insulation paste according to claim 1, wherein the refining agent is present and is in an amount of less than about 5 parts by weight per 100 parts of said $xSiO_2$—$yB_2O_3$—$zK_2O$.

7. An insulation paste according to claim 3, wherein the amount of $Al_2O_3$ filler is 0 parts.

8. An insulation paste according to claim 2, wherein the amount of $Al_2O_3$ filler is 0 parts.

9. An insulation paste according to claim 1, wherein the amount of $Al_2O_3$ filler is 0 parts.

10. An insulation paste according to claim 3, wherein the amount of the $Al_2O_3$ filler is 10–30 weight percent based on the total weight of the filler and glass.

11. An insulation paste according to claim 2, wherein the amount of the $Al_2O_3$ filler is 10–30 weight percent based on the total weight Of the filler and glass.

12. An insulation paste according to claim 1, wherein the amount of the $Al_2O_3$ filler is 10–30 weight percent based on the total weight of the filler and glass.

13. An insulation paste according to claim 3, wherein the filler is present and is in the form of an $Al_2O_3$ powder.

14. An insulation paste according to claim 2, wherein the filler is present and is in the form of an $Al_2O_3$ powder.

15. An insulation paste according to claim 1, wherein the filler is present and is in the form of an $Al_2O_3$ powder.

16. An insulation paste according to claim 3, wherein the filler is present and is in the form of an $Al_2O_3$ colloid.

17. An insulation paste according to claim 2, wherein the filler is present and is in the form of an $Al_2O_3$ colloid.

18. An insulation paste according to claim 11, wherein the filler is present and is in the form of an $Al_2O_3$ colloid.

19. An insulation paste according to claim 2, wherein the amount of organic vehicle is about 0.5 to 30 parts based on the weight of the paste.

20. An insulation paste according to claim 1, wherein the amount of organic vehicle is about 0.5 to 30 parts based on the weight of the paste.

* * * * *